United States Patent
Olarig et al.

(10) Patent No.: US 6,484,232 B2
(45) Date of Patent: Nov. 19, 2002

(54) ADAPTIVE CALIBRATION TECHNIQUE FOR HIGH SPEED MEMORY DEVICES

(75) Inventors: Sompong P. Olarig, Cypress, TX (US); John E. Jenne, Houston, TX (US)

(73) Assignee: Compaq Information Technologies Group, L.P., Houston, TX (US)

( * ) Notice: Subject to any disclaimer, the term of this patent is extended or adjusted under 35 U.S.C. 154(b) by 223 days.

(21) Appl. No.: 09/727,861

(22) Filed: Nov. 30, 2000

(65) Prior Publication Data

US 2002/0066001 A1 May 30, 2002

(51) Int. Cl.$^7$ ...................... G06F 11/30; G11C 11/4193
(52) U.S. Cl. ........................... 711/105; 714/42; 365/212
(58) Field of Search ................................ 365/211, 212; 711/105; 714/42

(56) References Cited

U.S. PATENT DOCUMENTS 5,084,791 A * 1/1992 Thanos et al. ............ 360/77.04
6,373,768 B2 * 4/2002 Woo et al. .................. 365/211

OTHER PUBLICATIONS

*Direct Rambus™ RIMM™ Module Specification Version 1.0*, Rambus Inc., SL–0006–100 (32 p.), 2000.
*Rambus® RIMM® Module (with 128/144Mb RDRAMs)*, Preliminary Information, Document DL0084 Version 1.1 (12 p.).
*Direct RDRAM™ 256/288–Mbit (512Kx16/18x32s)*, Preliminary Information Document, DL0060, Version 1.01 (69 p.).

* cited by examiner

*Primary Examiner*—David L. Robertson
(74) *Attorney, Agent, or Firm*—Conley, Rose & Tayon, P.C.; Michael F. Heim (57) ABSTRACT

A computer system with high-speed memory devices includes one or more temperature sensors and/or environmental sensors that monitor environmental parameters that may affect the operation of the high-speed memory devices. The sensor values are provided to control logic in a memory controller that can intelligently modify the operation of the memory devices in response to changing environmental conditions. Thus, in response to deteriorating environmental conditions, the memory controller may increase the frequency of calibration cycles. The sensors may be provided on multiple channels, if the memory system is configured with multiple channels, or may be individually associated with memory devices. In addition, the memory controller also monitors the expected remaining life of the memory devices, and the number of errors occurring in the memory devices, and based on these parameters, may change the frequency of the calibration cycles.

38 Claims, 9 Drawing Sheets

ADAPTIVE CALIBRATION TECHNIQUE FOR HIGH SPEED MEMORY DEVICES

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to memory systems that include high speed memory devices. More particularly, the present invention relates to memory systems, such as Direct Rambus Dynamic Random Access Memory (RDRAM), that require calibration cycles to insure proper operation. Still more particularly, the present invention relates to a memory system that includes a temperature sensor associated with high speed memory devices, and a memory controller that modifies the frequency of calibration cycles based on the readings received from the temperature sensor.

2. Background of the Invention

Almost all computer systems include a processor and a system memory. The system memory functions as the working memory of the computer system, where data is stored that has been or will be used by the processor and other system components. The system memory typically includes banks of dynamic random access memory (DRAM) circuits. According to normal convention, a memory controller interfaces the processor to a memory bus that connects electrically to the DRAM circuits. While DRAM circuits have become increasingly faster, the speed of memory systems typically lags behind the speed of the processor. Because of the large quantity of data that is stored in the system memory, it may at times be a bottleneck that slows down the performance of the computer system. Because of this disparity in speed, in most computer systems the processor must wait for data to be stored ("written") and retrieved ("read") from DRAM memory. The more wait states that a processor encounters, the slower the performance of the computer system.

The main memory provides storage for a large number of instructions and/or a large amount of data for use by the processor, providing faster access to the instructions and/or data than would otherwise be achieved if the processor were forced to retrieve data from a disk or drive. However, the access times of modem RAMs are significantly longer than the clock cycle period of modem processors. To minimize the latency of the system, various high-speed memory devices have been introduced to the market. An example of such a high-speed memory device is the Direct RDRAM device developed by Rambus. See "RAMBUS Preliminary Information Direct RDRAM™", Document DL0060 Version 1.01; "Direct Rambus™ RIMM™ Module Specification Version 1.0", Document SL-0006-100; "Rambus® RIMM™ Module (with 128/144 Mb RDRAMs)" Document DL00084, Version 1.1, which are incorporated by reference herein. As indicated in the Rambus specifications, the Direct RDRAM memory is capable of transferring 1.6 GB per second per DRAM device.

Each Direct RDRAM device typically includes 32 banks, with 512 rows per bank, although other size RDRAM devices may be available. Depending on the size of the RDRAM device, each row (or page) typically has either 1 kilobyte or 2 kilobytes of memory storage capability. The Direct RDRAM devices are arranged in channels, with each channel currently capable of supporting up to 16 Direct RDRAM devices. One or more Direct RDRAM devices may be packaged in Rambus In-line Memory Modules (RIMMs). Multiple channels may be provided in a computer system to expand the memory capabilities of the system.

While Direct RDRAM and similar memory devices are theoretically capable of operating at very high speeds, they exhibit certain severe operating constraints that can significantly degrade performance. To achieve the high operational speeds, the memory devices have very precise timing requirements, with very little margin or tolerance for deviation. Parameters for read transactions will be discussed briefly to illustrate some of the timing issues.

Figure 1:
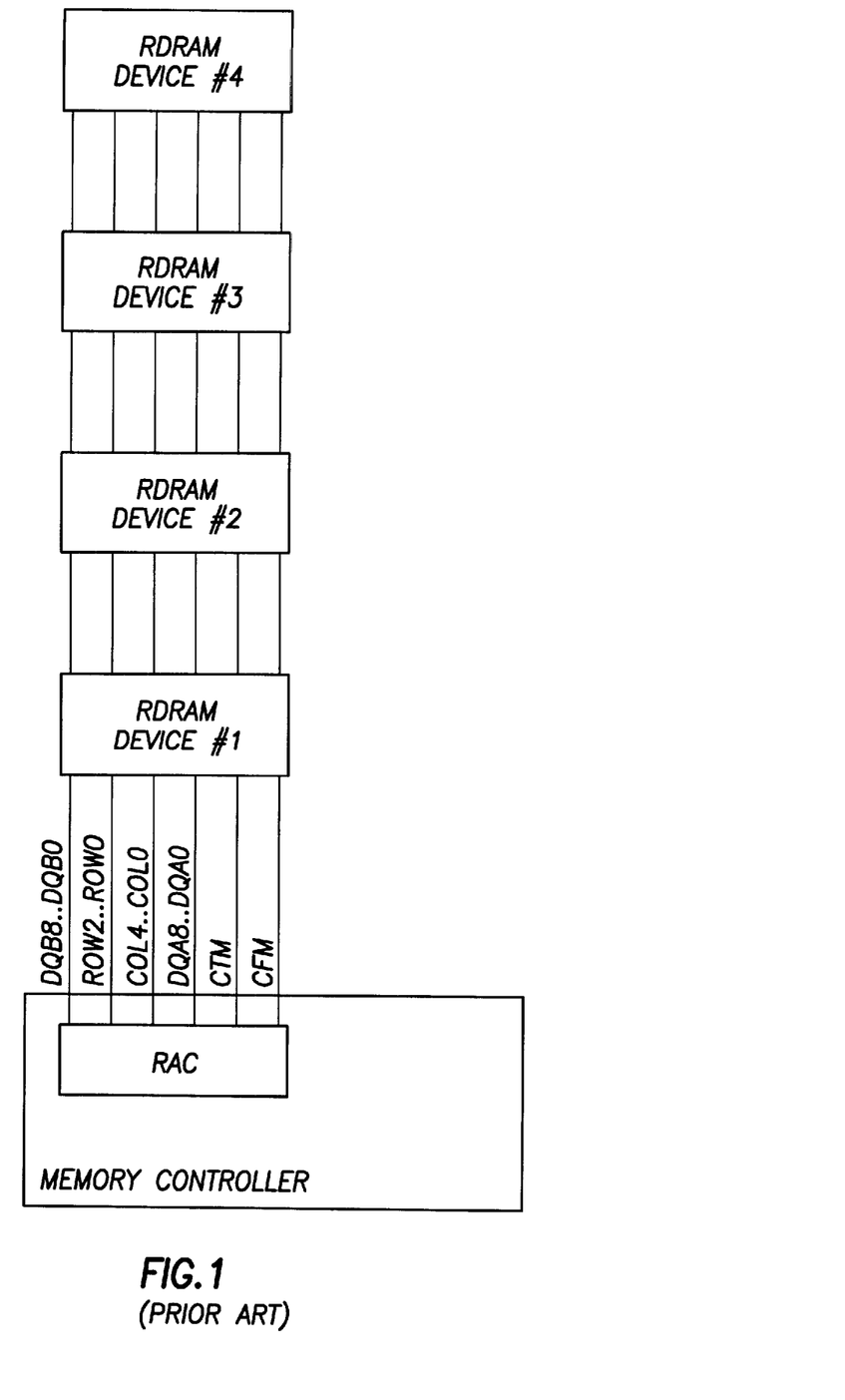
FIG. 1 is a prior art drawing showing the manner in which RDRAM devices couple to a memory controller.

As shown in FIG. 1, the Direct RDRAM couples to a memory controller (which includes a Rambus ASIC Cell or "RAC") via two clock signal lines, three Row signal lines, five Column signal lines, and two data busses. The clock lines include a Clock-to-Master (CTM) line, and a Clock-from-Master (CFM) line that are used to synchronize signals to the memory controller and from the memory controller, respectively. The Row signal lines and Column signal lines form part of a control and address bus (RQ bus) that typically includes eight lines. The Row signal lines (ROW2 ... ROW0) are used primarily to control row accesses in the memory, while the Column signal lines (COL4 ... COL0) are used primarily to control column accesses. The data busses include a DQA (DQA8 ... DQ0) and a DQB data bus (DQB8 ... DQ0), that couple to sense amps on opposite sides of the memory banks.

Figure 2:
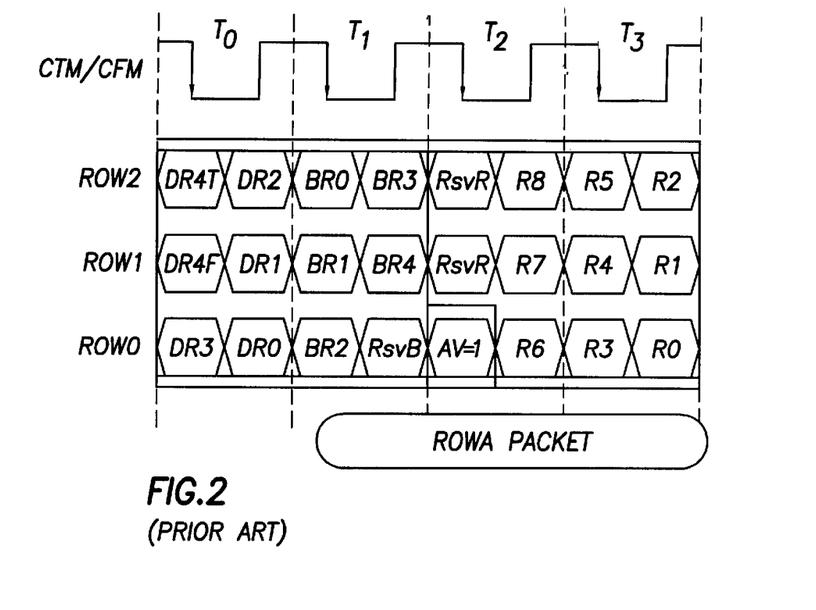
FIG. 2 is a prior art drawing showing a row activate packet for RDRAM devices.
Figure 3:
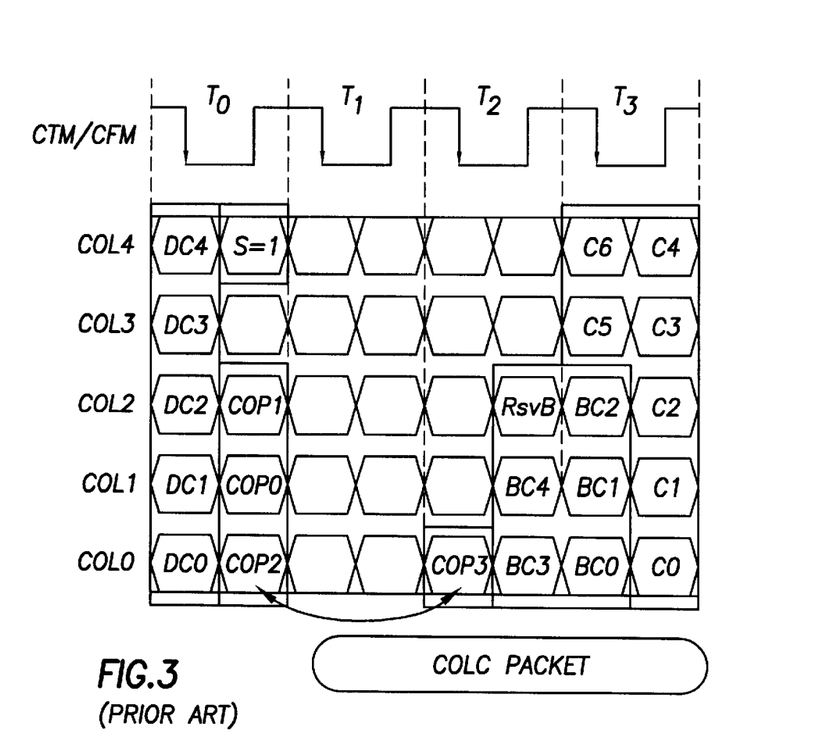
FIG. 3 is a prior art drawing showing a column operation packet for RDRAM devices.

The three Row lines identify which of the 512 possible rows is addressed by presenting nine row bits (R8 ... R0) in three subsequent half clock cycles ($2^9$=512), as shown in FIG. 2. The device row (DR) bits (DR3 ... DR0) identify which of the 16 possible memory devices is targeted, while the five Bank row (BR) bits (BR4 ... BR0) identify which of the 32 banks is targeted in that device. Similarly, and as shown in FIG. 3, the five Column lines identify which of the 64 possible columns is being addressed by presenting 7 column bits (C6 ... C0) in two subsequent half cycles. The device column (DC) bits (DC4 ... DC0) identify which of the memory devices is targeted, while the five Bank column (BC) bits (BC4 ... BC0) identify which of the 32 banks is targeted.

Figure 4A:
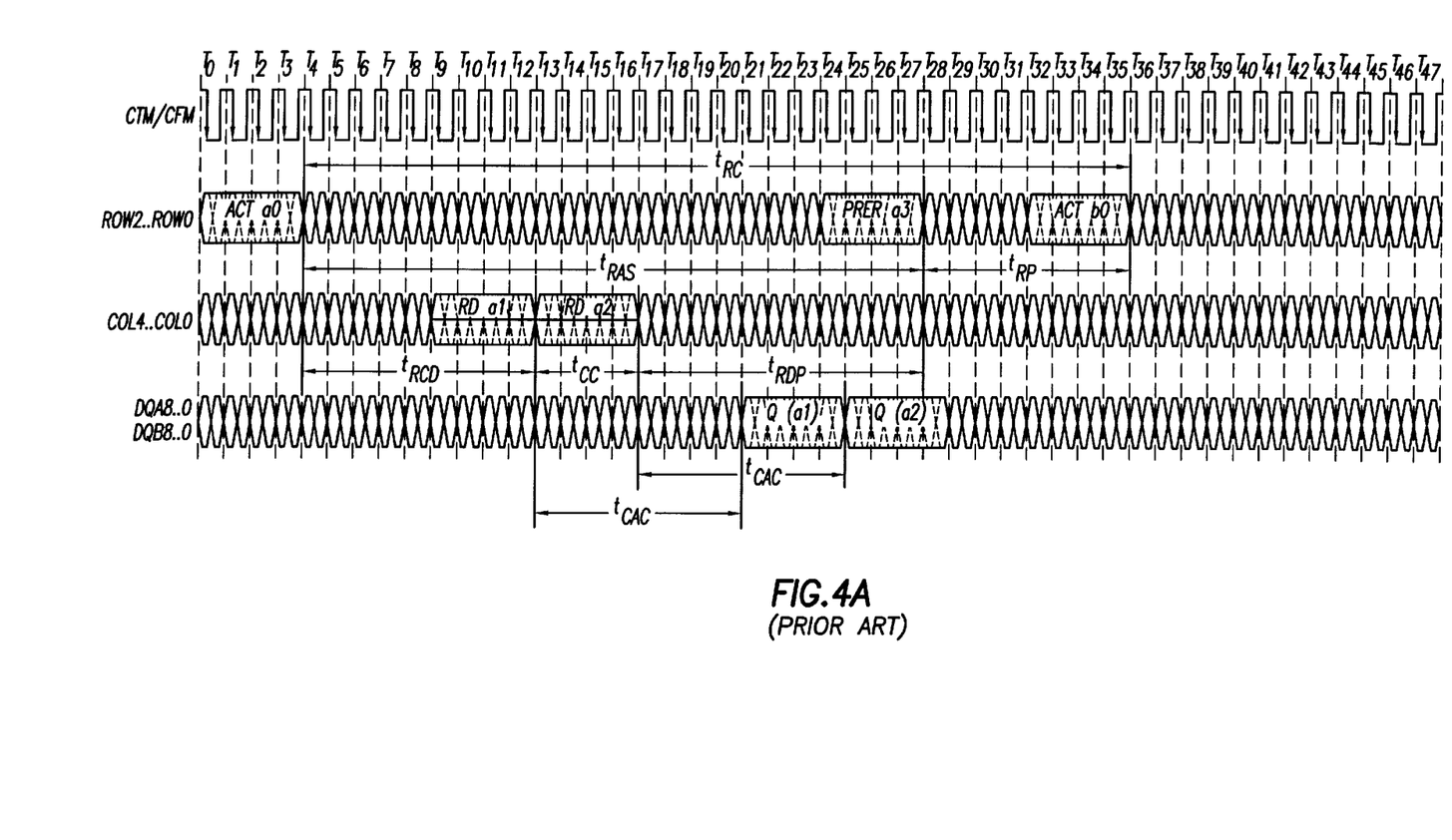
FIG. 4A is a prior art drawing showing a typical timing diagram for a read operation to an RDRAM device.

Referring to FIG. 4A, a read transaction is performed on a Direct RDRAM device by asserting an Activate command in a ROWA (row activate) packet on the Row signal lines. The Activate command identifies the device, bank and row address of the targeted memory location. A time period $t_{RCD}$ later, a Read command is issued in a Column operation (COLC) packet on the Column signal lines. The Read command identifies the device, bank, and column address of the targeted memory location. Thus, the Activate command and Read command in conjunction identify the specific memory location being accessed, with the Activate command identifying the row, and the Read command identifying the column.

A time period $t_{CAC}$ after the Read command, a read data dualoct (16 bytes) is returned by the targeted memory device. The time period $t_{CAC}$ includes one to five cycles of round-trip propagation delay on the channel. According to current Rambus specifications, the $t_{CAC}$ period may be programmed to a range of values that vary from 7 $t_{CYCLE}$ to 12 $t_{CYCLE}$. The particular value selected for $t_{CAC}$ depends on the number of RDRAM devices on the channel and the RDRAM timing bin so that the round trip propagation delay is equalized for all memory devices. Thus, based on the programmed timing parameters, the memory controller expects that during read cycles, all memory devices will return read data within a specified number of clock cycles after the Read command is asserted. Failure to return data in accordance with these timing parameters will cause data corruption, and may result in failure of the memory system.

The above timing parameters for a read transaction is just one example of the critical nature of timing in a high speed memory device, where the delay of a few nanoseconds can result in data corruption. Unfortunately, high-speed memory devices such as Direct RDRAM have proven highly susceptible to temperature and other environmental conditions such as humidity. If such conditions change during operation, the round-trip propagation delay of the signals propagating between the memory controller and the memory devices will be affected. If the actual propagation delay varies from the programmed delay, the memory system may experience data corruption.

Figure 4B:
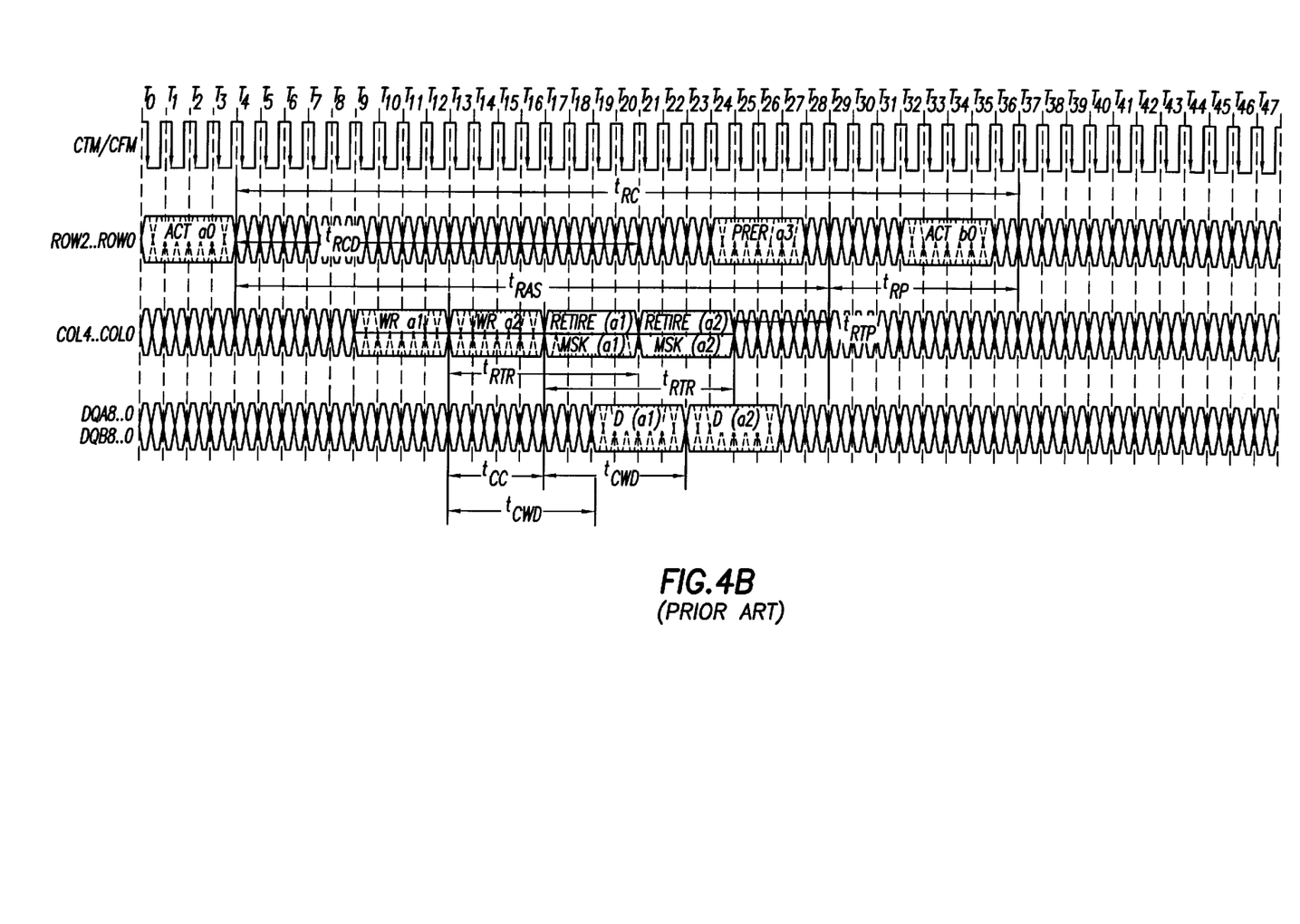
FIG. 4B is a prior art drawing showing a typical timing diagram for a write operation to an RDRAM device.

As shown in the example of FIG. 4B, a write transaction to an RDRAM memory device begins by activating a bank in a memory device with an Activate command in a ROW activate packet. A time period $t_{RCD}$–$t_{RTR}$ later, a Write command issues in a Column operation packet, with the $t_{RCD}$ interval measured to the end of the Column operation packet, with the first retire command. The Activate command includes the device, bank, and row address (abbreviated in FIG. 4B as a0), while the Write command includes device, bank, and column address (abbreviated as a1). A time period $t_{CWD}$ after the Write command, the write data dualoct D(a1) issues. A time period $t_{CC}$ after the first Column operation packet, a second Column operation packet issues on the Column wires, containing a Write a2 command. The a2 address has the same device and bank address as the a1 address, but a different column address. A time $t_{CWD}$ after the second Write command, a second write data dualoct D(a2) issues. A time $t_{RTR}$ after each Write command, a Column operation packet issues causing the write buffer to automatically retire. At the same time, a column mask packet may issue.

Subsequently, a Precharge command issues in a Row operation packet on the Row pins. This causes the addressed bank to precharge, so that a different row in that bank, or an adjacent bank, may be activated. The address (a3) includes the same device and bank address as the a0, a1, and a2 addresses. The Precharge command must occur a time period $t_{RAS}$ or more after the original Activate command. In addition, the Precharge command must occur a time period $t_{RTP}$ or more after the last Column operation packet that causes an automatic retire. A subsequent Activate command (b0) to the same device and bank, but different row, must occur a time $t_{RC}$ or more after the first Activate command, and a time $t_{RP}$ or more after the Precharge command to ensure that the bank and the associated sense amps are precharged. Thus, because transaction b targets the same device and bank, but a different row, it must not start until the prior transaction a completes. Transactions to other banks or other devices may be issued during transaction a.

Figure 5:
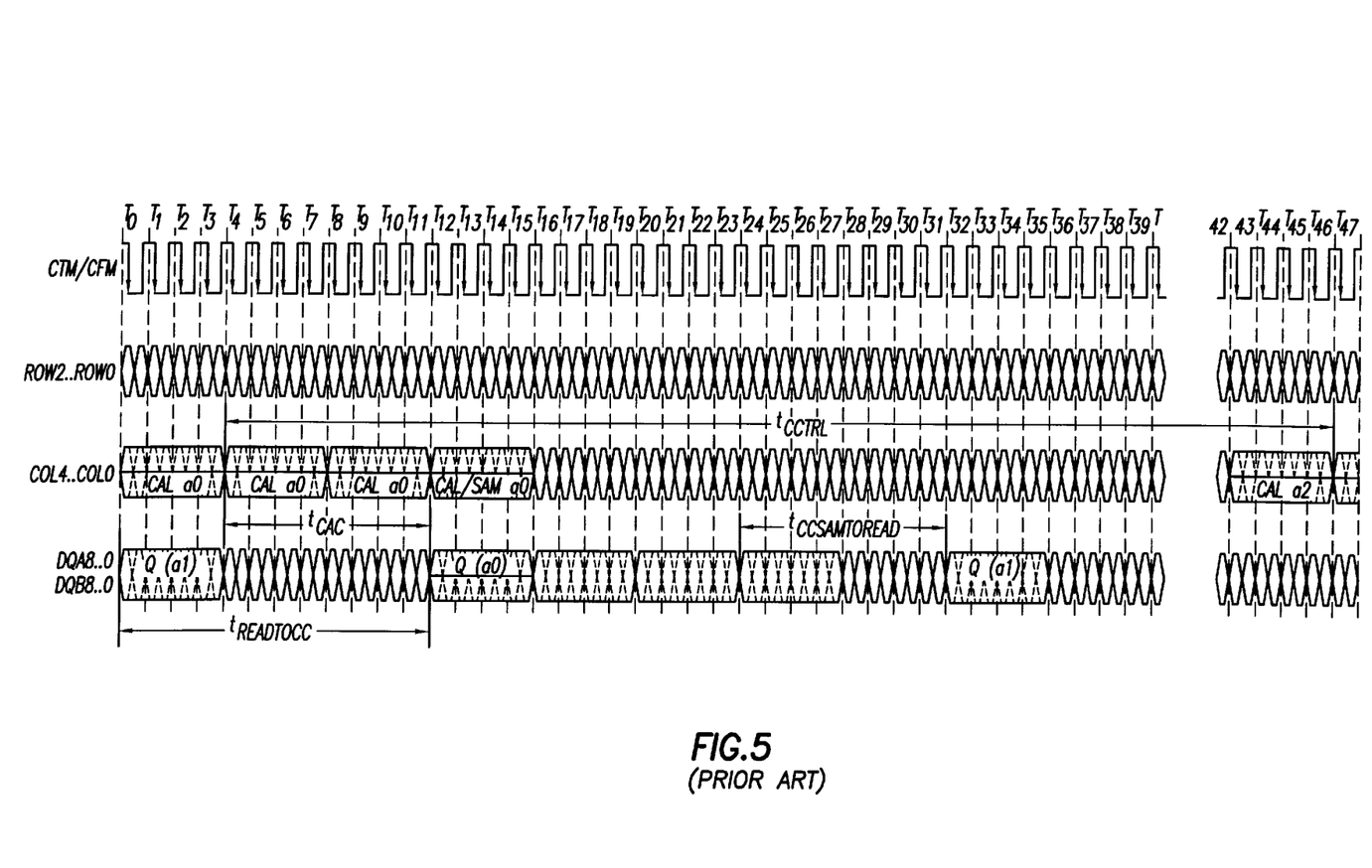
FIG. 5 is a prior art drawing showing a typical current calibration cycles to an RDRAM device.

In an attempt to resolve operational problems with high speed memory devices such as RDRAM, the memory controller may be designed or programmed to perform certain calibration cycles on a periodic basis. Thus, for example, memory controllers used with Direct RDRAM memory device perform current and temperature calibrations on a periodic basis. For current calibrations, a current calibration cycle is performed to every DRDAM device once every $t_{CCTRL}$ interval to maintain the $I_{OL}$ current output within its proper range. As shown in the example of FIG. 5, four Column extended operation (COLX) packets are asserted by the memory controller with a Calibrate (CAL) command. These Calibrate commands cause the RDRAM to drive four calibration packets Q(a0) a time period $t_{CAC}$ after the CAL command on the DQA4 . . . 3 and DQB4 . . . 3 wires. In addition, the TSQ bit of the INIT register is driven on the DQA5 wire during the same interval as the calibration packets. The TSQ bit indicates when a temperature trip point has been exceeded, as measured by temperature sensing circuitry. The last COLX packet from the memory controller includes a SAM command, concatenated with the last CAL command, that causes the RDRAM to sample the last calibration packet and adjust its $I_{OL}$ current value.

The Calibrate command must be sent on an individual basis to each RDRAM device so that calibration packets from other devices do not interfere with the calibration. Consequently, a current control transaction must be transmitted every $t_{CCTRL}$/N period, where N represents the number of RDRAMs resident on the channel. After each current calibration transaction, the device field Da of the address a0 in the Calibrate command is incremented.

Figure 6:
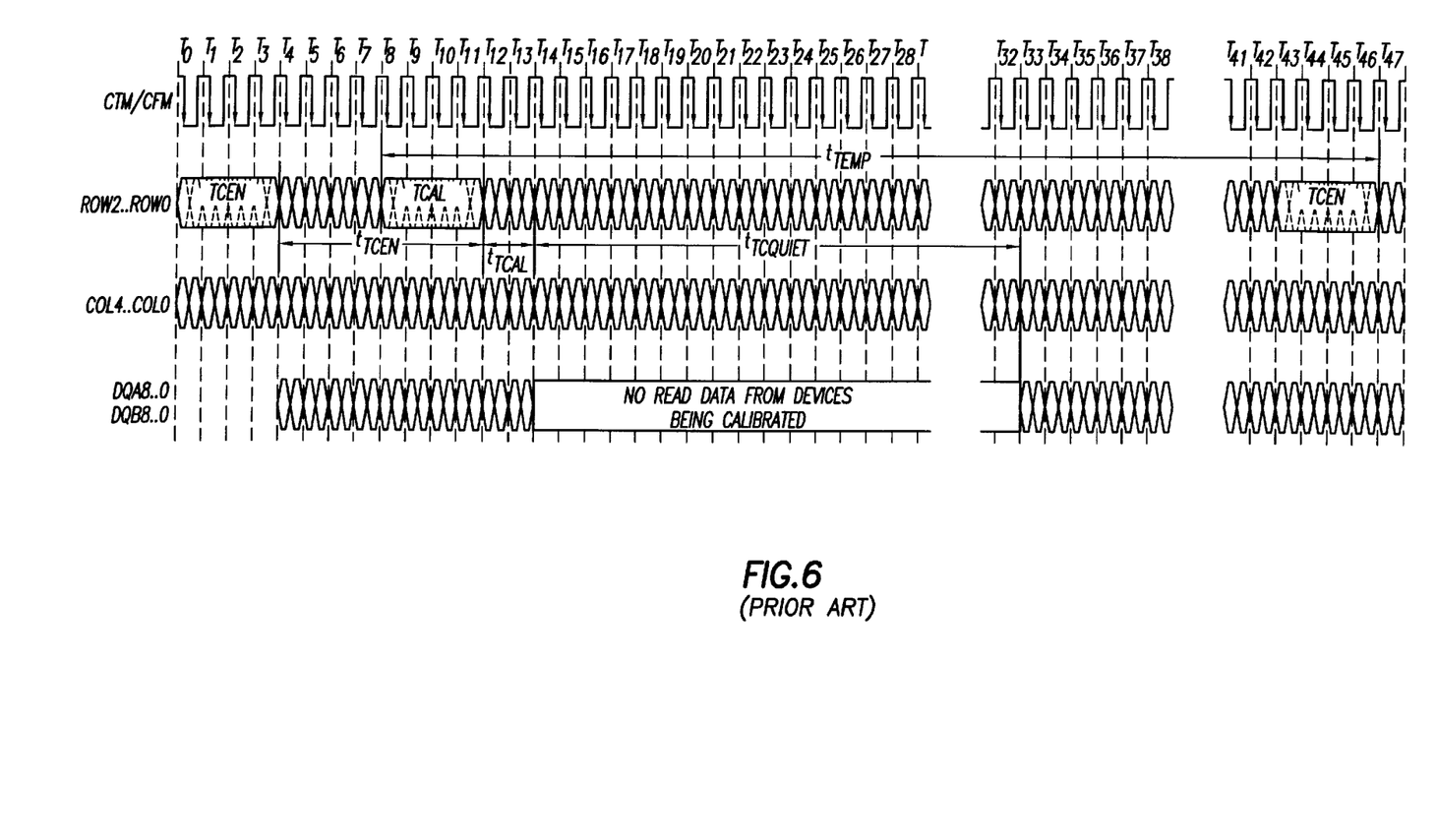
FIG. 6 is a prior art drawing showing a typical temperature calibration cycles to an RDRAM device.

Temperature calibration similarly is conducted on a periodic basis. As shown in FIG. 6, the temperature calibration sequence is broadcast once every $t_{TEMP}$ interval to all the RDRAMs on the channel. The TCEN and TCAL are row opcode field commands in a ROW operation packet. These commands cause the slew rate of the output drivers to adjust for temperature drift. During the quiet interval, $t_{TCQUIET}$, the devices being calibrated cannot be read, but can receive write transactions.

Thus, while Direct RDRAM is designed to calibrate memory devices based on current and temperature calibrations, these calibrations are performed on a rigid schedule to meet certain minimum timing requirements. In addition, these calibration cycles require long periods of idle time, during which no read cycle is permitted to the memory devices being calibrated. This idle time can add significant latency to any queued read cycles. Currently, the idle time for a Direct RDRAM temperature calibration cycle (the period defined for $t_{TCQUIET}$ is a minimum of 350 ns for a 800 MHz memory device (which is 140 clock cycles).

It would be desirable if a system could be developed that would provide greater flexibility in modifying timing parameters of memory components based on environmental conditions. It would also be advantageous if the memory controller was capable of making intelligent decisions regarding memory operating conditions based on existing environmental conditions. Despite the apparent advantages such a system would offer, to date no such system is available.

BRIEF SUMMARY OF THE INVENTION

The present invention solves the deficiencies of the prior art by implementing an intelligent memory controller that monitors the immediate environment of the memory devices. A temperature sensor or other environmental sensor may be provided in association with each memory device, with selected memory devices, or on a channel basis. According to the preferred embodiment, the memory controller preferably includes the capability of adapting the operation of the memory system in response to sensed environmental conditions by changing the frequency of the calibration cycles. In addition, other parameters affecting the operation of the memory devices may also be considered in scheduling calibration cycles, including any user defined parameters, the specified mean time between failure of memory devices, the error profile of the memory devices. Based on the temperature and other parameters, the memory controller adaptively modifies the calibration frequency to minimize usage of the memory bus, while ensuring that the memory devices are calibrated as often as necessary given the environmental and operational history of the memory devices.

According to an exemplary embodiment of the present invention, the memory system includes a memory controller that receives signals from a variety of environmental sensors, including temperature sensors, humidity sensors, and the like. The memory controller uses these input signals from the environmental sensors to dynamically determine calibration frequencies, thus adapting quickly to any changes in the environment. If the environment is stable, calibration may not be necessary, and therefore may be deferred to improve memory performance. Conversely, if a change in the environment occurs, a calibration may be scheduled. The calibration periods also may be varied depending on the degree of change that is measured by the sensors. Similarly, if environmental conditions improve, the memory controller may speed up the system, place all memory devices on-line, and/or decrease the frequency of calibration cycles. Similarly, the memory controller is cognizant of the operational history of the memory device, and the expected life of the memory device. If the number of memory errors increase, or if the memory device is approaching the end of its expected life, the memory controller can schedule calibration cycles more frequently to minimize errors and possibly extend the life of the memory device, or identify if the memory device needs replacing.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . .". Also, the term "couple" or "couples" is intended to mean either an indirect or direct electrical connection. Thus, if a first device couples to a second device, that connection may be through a direct electrical connection, or through an indirect electrical connection via other devices and connections. To the extent that any term is not specially defined in this specification, the intent is that the term is to be given its plain and ordinary meaning.

DETAILED DESCRIPTION OF THE PREFERRED EMBODIMENTS

Figure 7:
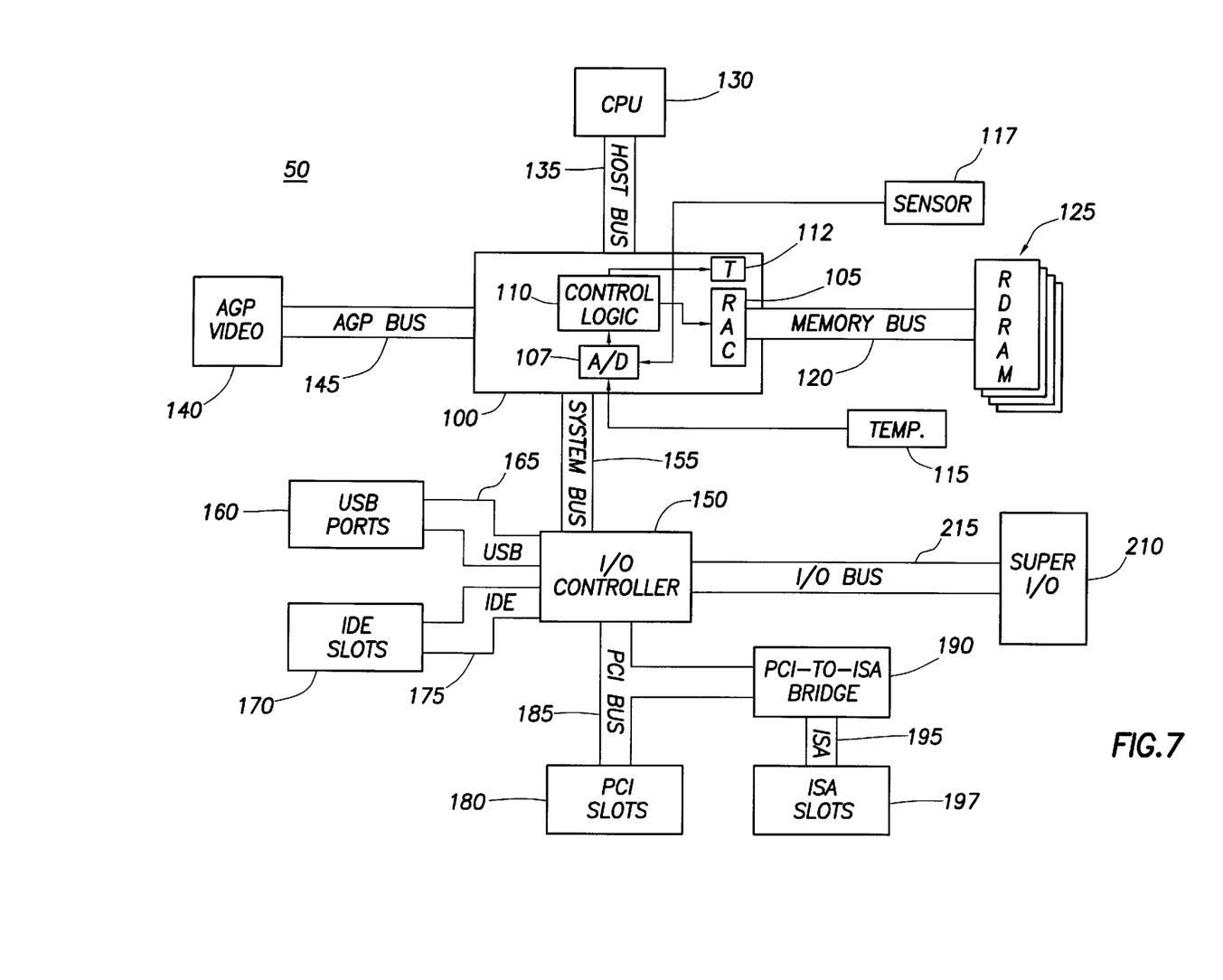
FIG. 7 is a block diagram illustrating an exemplary computer system that includes a single channel memory system and temperature sensor constructed in accordance with the preferred embodiment.

Referring initially to FIG. 7, a computer system 50 constructed in accordance with the preferred embodiment includes a CPU 130, a memory controller 100, a plurality of memory devices 125, a video controller 140, and various peripheral devices coupled to the computer system 50 via conventional peripheral system busses. According to the preferred embodiment of the present invention, one or more temperature sensors 115 is located on or adjacent the memory devices 125 to monitor the temperature at, or in the vicinity of, the memory devices. In addition, one or more additional environmental sensors 117 may be located on or adjacent the memory devices 125 to measure other environmental parameters that may affect the operation of the memory devices. Before discussing the temperature sensors and environmental sensors in more detail, the computer system 50 will first be discussed to provide some general background regarding the preferred implementation of the present invention. It should be understood, however, that the details of the computer system 50 may vary significantly from that shown in FIG. 7, without departing from the spirit of the present invention.

The computer system 50 may comprise a personal computer, a web computer, a server, or a workstation, without limitation. Although not shown, the computer system 50 preferably couples via a suitable network connection to a local area network (LAN). As shown in FIG. 7, the computer system 50 preferably implements a standard computer architecture, including a CPU (or processor) 130, system memory 125, a memory controller 100, AGP video controller 140, and I/O controller 150. The processor 130 preferably couples to the memory controller 100 through host bus 135. It should be understood that other embodiments of the invention may include more than one processor or CPU coupled to the host bus. The processor may comprise any suitable microprocessor such as the Pentium II®, Pentium III®, or Celeron® processor by Intel®, the Athlon® processor by AMD, or other microprocessors from these or other manufacturers that may be used or configured for use in a computer system. The system memory 125 preferably comprises one or more memory devices such as any suitable type of random access memory. System memory may comprise, for example, synchronous dynamic random access memory (SDRAM), or other memory designs suitable for use in a computer. According to the preferred embodiment, the system memory 125 comprises Rambus Direct RDRAM memory devices. The capacity of the RDRAM memory devices can be any suitable size. The Direct RDRAM memory devices are arranged in channels that couple separately to the memory controller 100 (only one such channel is shown in FIG. 7). Within each channel, a plurality of RDRAM memory devices may be provided (four RDRAM devices are shown for purposes of illustration in FIG. 7). Current Rambus specifications support 16 RDRAM memory devices per channel. One or more RDRAM memory devices may be implemented as Rambus In-line Memory Modules (RIMMs). The memory controller 100 preferably couples to the RDRAM memory devices through a conventional Rambus memory bus 120. A separate memory bus typically is provided for each memory channel.

The memory controller 100 permits the processor 130 and other devices in computer system 50 to read data from or write data to system memory 125. As shown in FIG. 7, the memory controller 100 preferably includes an interface to an advanced graphics port (AGP) to support a graphics video controller 140 or other graphics device. According to normal convention, an AGP bus 145 couples the video controller 140 to the memory controller 100. As one skilled in the art will understand, graphics processors or accelerators implementing other protocols also may be used instead of an AGP controller. Typically, a monitor (not shown) couples to the video controller 140.

The memory controller 100 also preferably functions as an interface to a system or peripheral bus 155. In the preferred embodiment, the system bus 155 comprises a high-speed data bus to the I/O controller hub 150. The I/O controller hub 150 bridges the system bus to a variety of peripheral busses, including a USB bus 165, an IDE bus 175, and a PCI bus 185. Coupled to each of these busses are ports or slots that enable compatible devices to be connected to the computer system. Thus, for example, a PCI peripheral device, such as a PCI-compatible network interface card (or NIC) may be inserted into one of the PCI slots 180, for coupling to the I/O controller 150 via the PCI bus 185. In similar fashion, USB devices may be connected to the computer system through one or more USB ports 160, and IDE devices may be connected to the system by inserting the IDE device in an available IDE slot 170. To support legacy ISA devices, a PCI-to-ISA bridge 190 preferably couples to the PCI bus 185. A conventional ISA bus 195 couples ISA slots 197 to the PCI-to-ISA bridge 190. Other devices, such as a modem, audio amplifier, or LAN connection may connect directly to the I/O controller hub 150, or may couple via the conventional peripheral busses.

As shown in FIG. 7, the I/O controller hub 150 preferably couples to a Super I/O controller 210 through an I/O bus 215. The Super I/O device 210 preferably includes conventional ports for coupling to floppy disk drives, a keyboard, and a mouse. Thus, the Super I/O device 210 preferably includes conventional keyboard and mouse controllers for converting user inputs to a traditional format for relaying to the CPU 130. The Super I/O also preferably includes standard parallel and serial ports to permit other peripheral devices to be added to the computer system 50.

Referring still to FIG. 7, at least one temperature sensor 115 is positioned adjacent to the memory devices 125 in one channel. The temperature sensor 115 couples to the memory controller 100, to provide the memory controller a continuous indication of the temperature at, or in the vicinity of, the memory devices. According to the preferred embodiment of FIG. 7, the memory controller 100 preferably includes a Rambus ASIC Controller (abbreviated as RAC) 105, which orchestrates the transfer of address, data, and control signals between the memory controller 100 and the Direct RDRAM memory devices 125. Thus, RAC 105 generates the necessary row (ROW), column (COL), clock (CTM, CFM), and data (DQA, DQB) signals to activate and precharge the memory devices, thereby enabling read, write and other transactions to be performed in the memory devices. The RAC includes an associated timer (T) 112 that indicates the time interval for conducting a temperature calibration and/or a current calibration. When the timer 112 expires, the RAC schedules a temperature calibration in accordance with the Rambus specification. According to the preferred embodiment, the timer 112 is programmable, and the value for the timer can be modified.

The memory controller 100 also preferably includes one or more analog-to-digital converters 107 that receive analog signals from any analog sensors, and convert those signals to digital values for processing by digital circuitry in the memory controller 100. The memory controller 100 also preferably includes control logic 110, which couples to the A/D converter 107 to receive digitized sensor values. The control logic 110 provides output signals to the timer 112, which can program the timer 112 with a different timer value. In addition, the control logic 110 also provides a control signal to RAC 105 to affect the operation of RAC 105, and hence, the memory devices on the channel. The memory controller 100 also includes other conventional logic (not shown) for interfacing the CPU 130, video controller 140, I/O controller, and memory 125, as will be understood by one skilled in the art.

Referring still to FIG. 7, in addition to temperature sensor 115, preferably one or more other environmental sensors 117 are included to monitor other environmental parameters, such as humidity, cosmic rays, UV light, vibration, electromagnetic energy, and the like. These sensors may also couple to the A/D circuitry 107 through a multiplexing or other sharing arrangement, or additional A/D circuitry may be provided for each sensor. Alternatively, the A/D circuitry may be moved to the sensor, or to another location off the memory controller, if desired.

The temperature sensor 115 preferably measures temperatures very precisely, thereby indicating to the control logic 110 any change in temperature that may effect the operation of the memory devices in the system. Preferably, the sensitivity of the temperature sensor is coordinated with the temperature specifications for the memory devices, so that the smallest temperature change that may cause data corruption is detected by the sensor 115 and supplied to the control logic 110.

In response to the signals from the temperature sensor 115 and/or the environmental sensor 117, the control logic 110 may be programmed to modify the operation of the memory devices 125. Thus, for example, the control logic 110 may be programmed to increase the frequency of temperature calibrations for each incremental change in temperature, by changing the value of the timer 112. Alternatively, the control logic may be programmed to increase the frequency of the temperature calibrations by an amount that varies with specific temperature ranges. As yet another alternative, the time period over which the temperature change occurs may also be considered when adjusting the calibration frequency. Also, the degree (or slope) of temperature change may be considered in conjunction with proscribed time periods. As one skilled in the art will appreciate, any sort of proportional (P), proportional-integral (PI), or proportional-integral-derivative (PID) control may be used in adjusting the frequency of the calibration cycles. Similarly, a change in environmental sensor 117 may also be used to adjust the calibration frequency. Thus, for example, if the humidity in the vicinity of the memory rises, the frequency of temperature calibrations may be increased.

In addition to considering environmental parameters such as temperature, according to the preferred embodiment of the present invention, the memory controller also is programmed to store retrieve the expected life of the memory devices (mean time between failure), the actual life of the memory devices, the error profile for the memory device or module, and any other parameter that may affect the timing of the high speed memory devices, including any user defined parameters. The memory controller also may be programmed to generate profiles for the life of the memory devices to identify periods when the memory device is subjected to unusually harsh environmental conditions that may compromise the life of the memory devices. Thus, the control logic preferably is used to intelligently monitor the remaining useful life of the memory devices, and to also monitor the error history of the memory devices. As the remaining useful life of a memory device approaches, or if the error history of the memory device increases, the control logic may increase the frequency of calibrations to reduce the number of memory errors that may otherwise result from a memory device that is approaching the end of its useful life. In addition, the control logic may decrease the frequency of calibration cycles if the memory device is relatively young, and if environmental conditions remain constant, or improve.

Figures 8, 9:
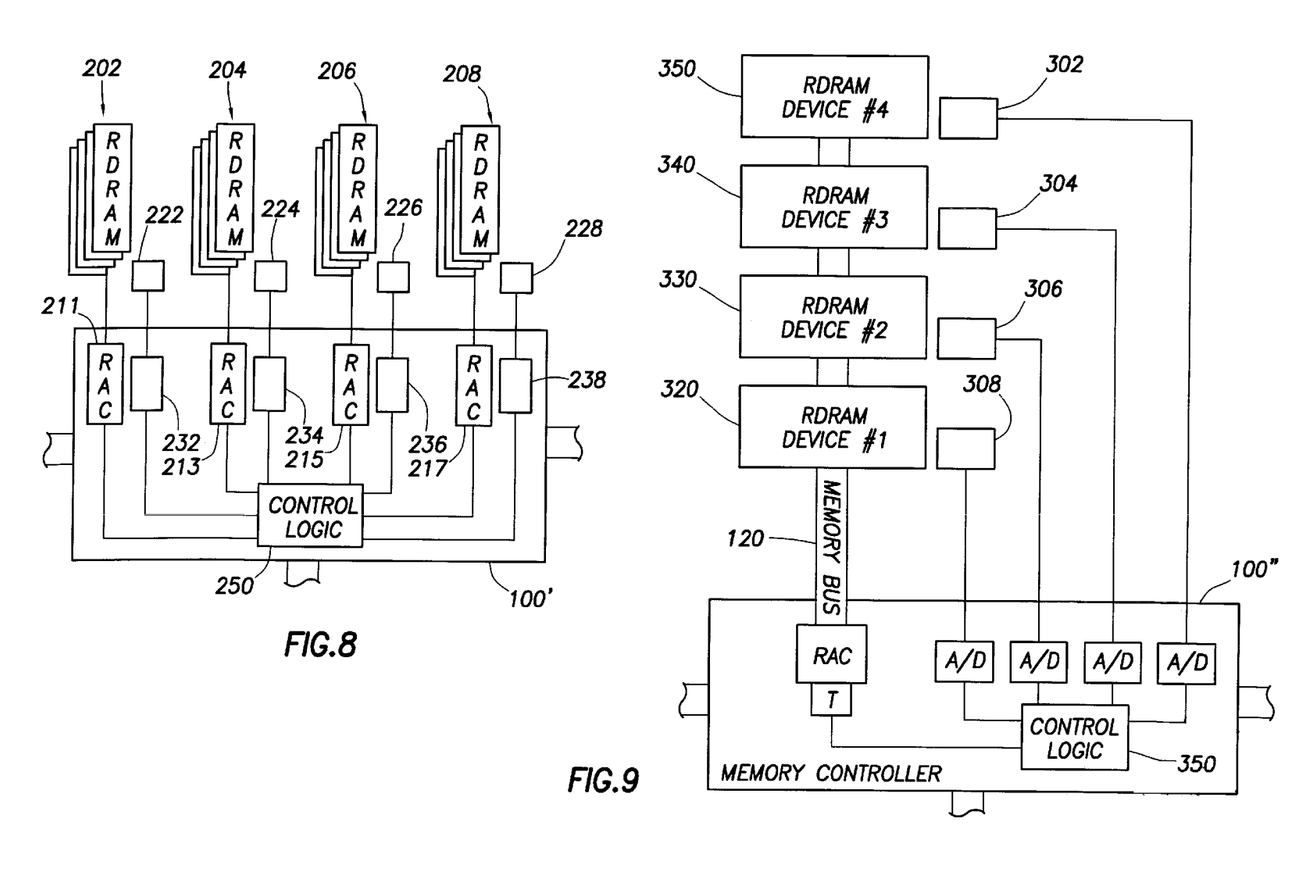
FIG. 8 is a block diagram illustrating a memory system with multiple channels, constructed in accordance with the preferred embodiment.
FIG. 9 is a block diagram illustrating a single channel memory system constructed in accordance with an alternative embodiment of the present invention.

Referring now to FIG. 8, the present invention also may be used in computer systems that implement multiple memory channels. Four memory channels 202, 204, 206, 208 are shown in FIG. 8 for purposes of illustration. Each of the memory channels operates under the control of an associated RAC 211, 213, 215, 217, with a separate Rambus memory bus coupling the memory in a particular channel with its associated RAC. According to the preferred embodiment, each channel includes a temperature sensor located in the vicinity of each memory channel. Thus, as shown in FIG. 8, temperature sensors 222, 224, 226, 228 are placed adjacent memory channels 202, 204, 206, 208, respectively. Each of the temperature sensors couple to an associated A/D converter, 232, 234, 236, 238, located in memory controller 100', or at any other convenient location. Alternatively, the A/D conversion function may be implemented in one or more shared analog-to-digital converters. That operate using a multiplexing scheme. The A/D converters 232, 234, 236, 238 couple to control logic 250, which is capable of changing the calibration timer values for each of RACs 211, 213, 215, 217. In addition, the control logic 250 may send control signals to the RACs 211, 213, 215, 217 to place one or more of the memory devices in a particular channel in a low power mode, or change the operating frequency of the memory bus for a channel. In addition, although not shown, environmental sensors also may be provided for each channel, consistent with the operation described in relation to FIG. 7.

Referring still to FIG. 8, if the channels are operated in lock-step fashion as a single wide memory, the control logic 250 may process the input signals from each of the sensors (temperature and/or environmental), and take the average, or process the input values with some weighting or averaging scheme, as desired by the system designer. The averaged or weighted value may then be used to adjust calibration frequency, or to implement some other modification to memory operation. Alternatively, the control logic 250 may discard high and low temperature readings and average the other readings to determine temperature, even in the event that one or more sensors malfunctions. Various other implementations and techniques for accurately determining temperature from the multiple sensors may be used without departing from the principles of the present invention.

Referring now to FIG. 9, temperature sensors 302, 304, 306, 308 may be provided individually to each RDRAM device in each channel, or to each RIMM in each channel. In FIG. 9, four such RDRAM devices 320, 330, 340, 350 are shown. Thus, in this example, temperature sensor 302 is placed either on, or adjacent to, RDRAM device 350. Similarly, temperature sensor 304 is located near RDRAM device 340, sensor 306 is located adjacent RDRAM 330, and sensor 308 is positioned by RDRAM 320. As noted above in relation to FIGS. 7 and 8, the temperature signals are digitized by A/D converters (or one A/D converter), and provided to control logic 350, which then is capable of modifying one or more operational parameters of the memory devices in the system by transmitting control signals to the RAC (or calibration timer) associated with each channel. As will be apparent from the discussion above, other environmental sensors may be used instead of temperature sensors, or in combination with temperature sensors.

As an alternative to a 1 to 1 allocation of sensors to channels or to RDRAM devices or to RIMMs, other allocation schemes may also be used without departing from the principles of the present invention. Thus, for example, temperature sensors may be strategically located on opposite sides of a channel of memory devices, or may be interspersed throughout the channel, and among multiple channels.

Figure 10:
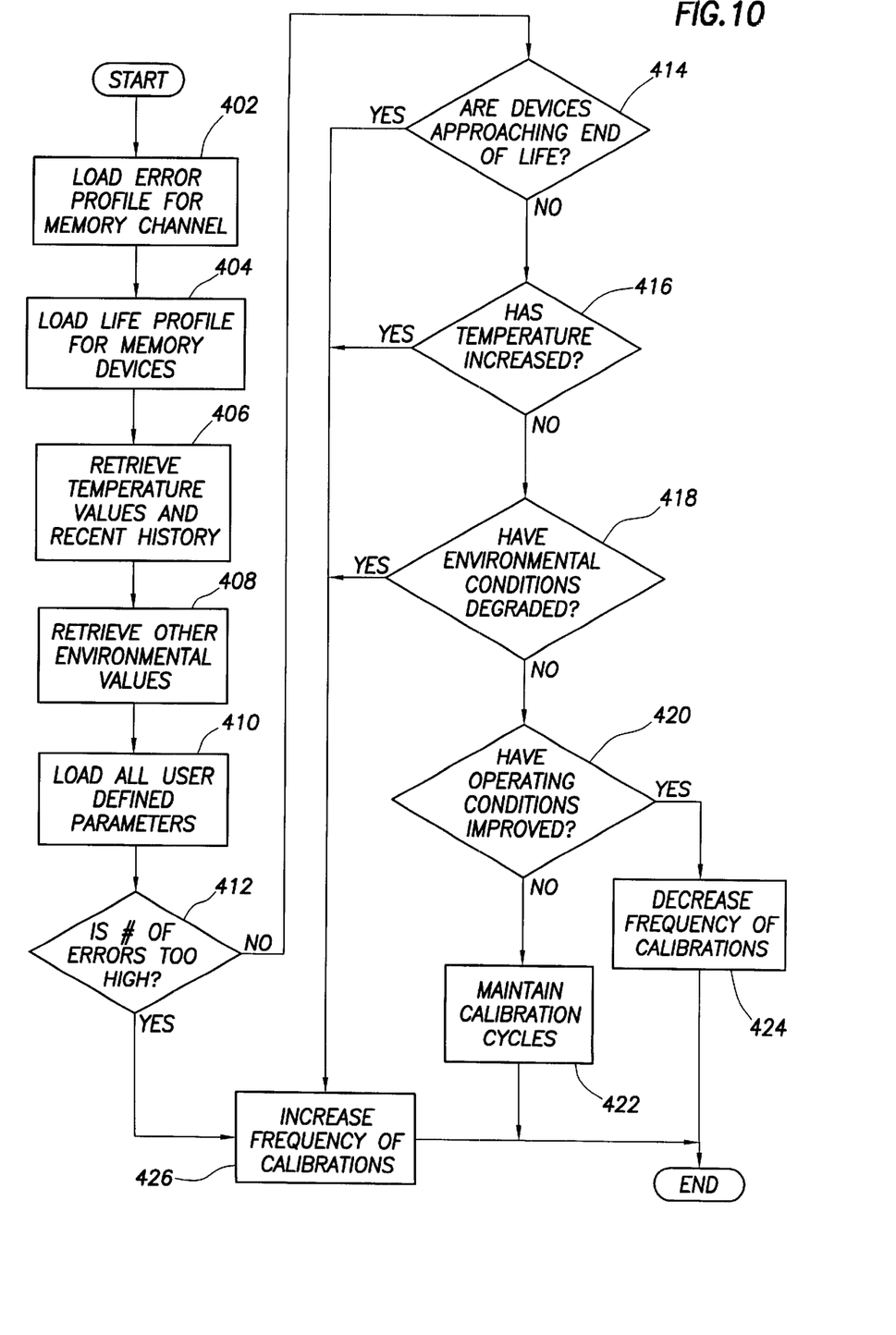
FIG. 10 is a flow chart depicting an exemplary operation of the control logic of FIG. 7.

Referring now to FIG. 10, an example of a flow chart for modifying the calibration frequency is shown for purposes of illustration, with the understanding that other operational schemes or algorithms may be readily developed for implementing a memory controller in accordance with the principles of the present invention. The flow logic depicted in FIG. 10 preferably is designed to run periodically on the control logic in the memory controller, or on any other suitable processor in the computer system, with the period determined by the system designer. Preferably, the flow logic of FIG. 10 is repeated for each channel, so a decision is made on a channel-by-channel basis as to whether the calibration frequency for that channel should be altered. As one skilled in the art will understand, the flow logic of FIG. 10 may be implemented as a state machine, firmware, or as a separately executing program.

When the flow logic is initiated, error profiles are retrieved by the control logic for a specific memory channel in step 402. The error profiles may indicate memory errors as a whole, by channel, or by memory devices on the channel, depending on the degree of resolution available. Information regarding errors, and when they occurred may be stored in a suitable register for recall by the control logic using the flow logic of FIG. 10. The error profiles may reflect cumulative errors, or may reflect errors during a selected period (such as the number of errors since the most recent system initialization), or both. Next, in step 404, a life profile is loaded for each memory device, or on a channel basis. Thus, information is stored in a suitable register indicating the expected life of the memory device, the total period of usage to date, and any other factors that may affect life, such as periods during which the memory device was subjected to extreme environmental conditions that could result in premature aging of the memory device. In step 406, the flow logic causes the control logic to retrieve the most recent temperature values, and may also retrieve additional information from a suitable register indicating temperature changes over a predetermined period. The control logic similarly retrieves other environmental values obtained from other environmental sensors in the system, as indicated in step 408. Any user-defined parameters of interest are loaded in step 410.

The control logic next determines if the number of memory errors is excessive in step 412, either on a cumulative basis, or during a prescribed time period. If so, the control logic 110 (FIG. 7) causes the value in timer 112 to be decreased to increase the frequency of calibration cycles, as shown in step 426. If the number of errors is within a predetermined tolerance level, the control logic next determines in step 414 if any memory devices within a channel are approaching the end of their useful life. If the control logic determines that one or more memory devices may be approaching the end of its life, the control logic will increase the frequency of calibration cycles for that memory device by increasing the calibration frequency for that channel. If the memory devices have acceptable life remaining, the control logic determines if the temperature has increased beyond a threshold value (step 416), based either on degree of change, or degree of change within a period, or both. If so, the calibration frequency is increased. A similar analysis is performed in step 418 for any other environmental parameters that are sensed by the system. In step 420, the control logic determines if the calibration frequency may be reduced. Thus, in step 420 the control logic determines if conditions have improved, which may occur if temperature decreases, environmental conditions improve, new memory devices have been substituted for older components, and the like. If any of these, or other similar beneficial conditions exist, the calibration frequency may be decreased as shown in step 424. In addition, if environmental conditions remain static, the calibration frequency may also be decreased. Thus, the control logic may continue to reduce calibration frequency until a minimum frequency is reached (which may be pre-set or may be based on historical values), or until error conditions begin to rise. Lastly, if no changes are necessary to the calibration cycle, the control logic decides to maintain current calibration settings in step 422. The flow logic is then repeated on a regular basis for each channel. Alternatively, the flow logic may be called in response to an interrupt caused by system errors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A computer system, comprising:
 a CPU;
 a memory controller coupled to said CPU;
 a system memory coupled to said memory controller, with said memory controller controlling and formatting transactions to the system memory;
 wherein said memory controller runs calibration cycles to said system memory to re-calibrate said system memory, and wherein said memory controller is capable of varying the frequency of said calibration cycles based on at least one parameter that may affect the operation of the system memory.

2. The system of claim 1, further comprising an environmental sensor that couples to said memory controller to provide a signal to said memory controller representing at least one environmental parameter, and wherein said memory controller is capable of changing the frequency of the calibration cycles in response to the signal from said environmental sensor.

3. The system of claim 2, wherein the calibration cycles comprise a temperature calibration cycle.

4. The system of claim 2, wherein the calibration cycles comprise a current calibration cycle.

5. The system of claim 2, wherein said environmental sensor comprises at least one temperature sensor.

6. The system of claim 5, wherein the system memory comprises a plurality of RDRAM devices, and wherein said temperature sensor is located adjacent said RDRAM devices.

7. The system of claim 6, further comprising a second environmental sensor located adjacent said RDRAM devices to measure a second environmental parameter.

8. The system of claim 7, wherein the second environmental sensor measures humidity in the vicinity of the RDRAM devices, and provides a signal indicating humidity in the vicinity of the RDRAM devices to said memory controller, and wherein said memory controller is capable of changing the frequency of said calibration cycles in response to a change in humidity.

9. The system of claim 5, wherein the system memory comprises a plurality of RDRAM devices, and wherein said temperature sensor is located adjacent said RDRAM devices.

10. The system of claim 5, wherein the system memory comprises a plurality of RDRAM devices arranged in multiple channels, and wherein at least one temperature sensor is associated with each channel.

11. The system of claim 10, further comprising a second environmental sensor associated with each channel to measure a second environmental parameter in the vicinity of each channel.

12. The system of claim 1, wherein said at least one parameter includes the remaining life of said RDRAM devices.

13. The system of claim 1, wherein said at least one parameter includes the error profile of said system memory.

14. The system of claim 13, wherein said system memory comprises a plurality of RDRAM memory devices, and said error profile indicates the number of memory errors that have occurred in said RDRAM memory devices.

15. The system of claim 13, wherein said system memory includes a plurality of RDRAM memory devices arranged in multiple channels, and said error profile indicates the number of memory errors that have occurred in a particular channel.

16. The system of claim 1, wherein said system memory includes one or more RDRAM devices, and said at least one parameter includes the temperature in the vicinity of the RDRAM devices.

17. The system of claim 1, wherein said system memory includes a plurality of high-speed DRAM memory devices arranged in channels, with an environmental sensor associated with each channel, and said memory controller includes control logic that modifies the frequency of said calibration cycles in a channel in response to the environmental parameter detected by said environmental sensor associated with that channel.

18. The system of claim 17, wherein said environmental sensor comprises a temperature sensor.

19. The system of claim 17, wherein the environmental sensor comprises a humidity sensor.

20. The system of claim 1, wherein said system memory includes a plurality of high-speed DRAM memory devices, and said memory controller monitors the expected life of the DRAM memory devices, the number of memory errors occurring in the DRAM memory devices, and the temperature in the vicinity of the DRAM devices, in determining whether to change the frequency of the calibration cycles.

21. The system of claim 20, wherein the memory controller also monitors another environmental condition in the vicinity of the DRAM devices in determining whether to change the frequency of the calibration cycles.

22. The system of claim 21, wherein the environmental condition comprises humidity.

23. The system of claim 20, wherein the environmental condition comprises a light parameter.

24. A computer system, comprising:
a CPU;
a system memory comprising a plurality of high-speed DRAM memory devices coupled to said CPU;
a memory controller coupling said system memory to said CPU, said memory controller controlling and formatting transactions to the DRAM memory devices, and wherein said memory controller monitors an operating condition that may affect the operation of said DRAM memory devices; and
wherein said memory controller periodically runs calibration cycles to said DRAM memory devices, and wherein said memory controller modifies the frequency of at least one of said calibration cycles in response to a change in the operating condition.

25. The system of claim 24, wherein said high-speed DRAM memory devices comprise Direct RDRAM memory devices.

26. The system of claim 24, wherein the calibration cycles comprise a temperature calibration cycle.

27. The system of claim 24, wherein the calibration cycles comprise a current calibration cycle.

28. The system of claim 24, wherein said memory controller measures the operating condition via signals received from an environmental sensor positioned adjacent said DRAM memory devices.

29. The system of claim 28, wherein said environmental sensor includes a plurality of temperature sensors, with a separate temperature associated with each RDRAM device.

30. The system of claim 28, wherein said memory controller measures the operating condition via signals received from a second environmental sensor located adjacent said DRAM devices.

31. The system of claim 28, wherein the memory controller includes a Rambus interface module and a timer, and wherein said interface module runs calibration cycles periodically as indicated by said timer.

32. The system of claim 31, wherein the memory controller further includes control logic that receives signals from a temperature sensor, and in response, changes the value in said timer to vary the frequency of the calibration cycle.

33. The system of claim 32, wherein said memory controller further comprises an analog-to-digital converter that converts the signal from said temperature signal to a digital value for processing by said control logic.

34. The system of claim 28, wherein the system memory comprises a plurality of RDRAM devices arranged in multiple channels, and wherein at least one temperature sensor is associated with each channel.

35. The system of claim 28, wherein said operating condition includes the expected remaining life of each of said DRAM devices.

36. The computer system of claim 28, wherein said operating condition includes the number of errors occurring said DRAM memory devices.

37. A computer system, comprising:
a CPU;
a memory controller coupled to said CPU;
a video controller coupled to said memory controller;
an I/O controller hub coupled to said memory controller, said I/O controller hub connecting to at least one peripheral bus for coupling to a peripheral device;
a system memory comprised of multiple DRAM memory devices coupled to said memory controller, with said memory controller controlling and formatting transactions to the DRAM memory devices originating from said CPU and other computer system components, including said peripheral device;
wherein said memory controller runs calibration cycles to said DRAM memory devices to re-calibrate said memory devices, and wherein said memory controller is capable of varying the frequency of said calibration cycles based on an error profile of said DRAM memory devices.

38. A computer system, comprising:
a CPU;
a memory controller coupled to said CPU;
a video controller coupled to said memory controller;
an I/O controller hub coupled to said memory controller, said I/O controller hub connecting to at least one peripheral bus for coupling to a peripheral device;
a system memory comprised of multiple DRAM memory device coupled to said memory controller, with said memory controller controlling and formatting transactions to the DRAM memory devices originating from said CPU and other computer system components, including said peripheral device;
wherein said memory controller runs calibration cycles to said DRAM memory devices to re-calibrate said memory devices, and wherein said memory controller is capable of varying the frequency of said calibration cycles based on the expected remaining life of at least one of said DRAM memory devices.

* * * * *